United States Patent
Kubota (10) Patent No.: US 8,357,997 B2
(45) Date of Patent: Jan. 22, 2013

(54) ORGANIC EL DEVICE AND MANUFACTURING METHOD THEREOF

(75) Inventor: Hirofumi Kubota, Kanazawa (JP)

(73) Assignee: Japan Display Central Inc., Fukaya-shi (JP)

(*) Notice: Subject to any disclaimer, the term of this patent is extended or adjusted under 35 U.S.C. 154(b) by 197 days.

(21) Appl. No.: 12/817,483

(22) Filed: Jun. 17, 2010

(65) Prior Publication Data

US 2010/0327268 A1    Dec. 30, 2010

(30) Foreign Application Priority Data

Jun. 29, 2009  (JP) .................. 2009-153913

(51) Int. Cl.
    *H01L 23/58*   (2006.01)

(52) U.S. Cl. .............. 257/642; 438/624; 257/E51.001

(58) Field of Classification Search .................. None
    See application file for complete search history.

(56) References Cited

U.S. PATENT DOCUMENTS

| | | | |
|---|---|---|---|
| 2008/0024402 A1* | 1/2008 | Nishikawa et al. | 345/82 |
| 2009/0108742 A1 | 4/2009 | Kubota | |
| 2010/0090589 A1 | 4/2010 | Itagaki et al. | |

FOREIGN PATENT DOCUMENTS

| | | |
|---|---|---|
| JP | 11-224781 | 8/1999 |
| JP | 2000-91067 | 3/2000 |
| JP | 2001-35667 | 2/2001 |
| JP | 2002-91067 | 3/2002 |
| JP | 2003-31360 | 1/2003 |
| JP | 2003-257675 | 9/2003 |
| JP | 2003-338383 | 11/2003 |
| JP | 2007-288074 | 11/2007 |
| JP | 2007-533104 | 11/2007 |
| JP | 2008-270731 | 11/2008 |
| JP | 2009-44101 | 2/2009 |
| WO | WO 2006/085615 A1 | 8/2006 |
| WO | WO 2008/149498 A1 | 12/2008 |

OTHER PUBLICATIONS

Office Action issued Apr. 19, 2011, in Japanese Patent Application No. 2009-153913 (with English-language translation).

* cited by examiner

*Primary Examiner* — Julio J Maldonado
*Assistant Examiner* — Sonya McCall Shepard
(74) *Attorney, Agent, or Firm* — Oblon, Spivak, McClelland, Maier & Neustadt, L.L.P.

(57) ABSTRACT

According to one embodiment, an organic EL device includes a pixel electrode, an organic layer disposed above the pixel electrode, a counter-electrode disposed above the organic layer, and an oxide layer disposed between the pixel electrode and the organic layer, the oxide layer including a first region formed with a first film thickness over a first area and a second region formed with a second film thickness which is less than the first film thickness, over a second area which is less than the first area.

10 Claims, 5 Drawing Sheets

ORGANIC EL DEVICE AND MANUFACTURING METHOD THEREOF

CROSS-REFERENCE TO RELATED APPLICATIONS

This application is based upon and claims the benefit of priority from Japanese Patent Application No. 2009-153913, filed Jun. 29, 2009; the entire contents of which are incorporated herein by reference.

FIELD

Embodiments described herein relate generally to an organic electroluminescence (EL) device and a manufacturing method thereof.

BACKGROUND

In recent years, display devices using organic electroluminescence (EL) elements have vigorously been developed, which have features of self-emission, a high response speed, a wide viewing angle and a high contrast, and which can realize small thickness and light weight.

Patent document 1 (Jpn. Pat. Appln. KOKAI Publication No. 2008-270731), for instance, discloses an organic EL element including a buffer layer, which is composed of a multilayer structure of inorganic materials with hole transportability and electron-blocking properties, between a pixel electrode and an organic light emission layer. In particular, this patent document 1 discloses, as the buffer layer, a multilayer structure comprising a hole transport layer and a functional layer, which are formed of, e.g. an oxide, a nitride, or an oxynitride of a transition metal.

DETAILED DESCRIPTION

In general, according to one embodiment, there is provided an organic EL device comprising: a pixel electrode; an organic layer disposed above the pixel electrode; a counter-electrode disposed above the organic layer; and an oxide layer disposed between the pixel electrode and the organic layer, the oxide layer including a first region formed with a first film thickness over a first area and a second region formed with a second film thickness which is less than the first film thickness, over a second area which is less than the first area.

According to another embodiment, there is provided an organic EL device comprising: a pixel electrode; a first hole transport layer or a hole injection layer which is disposed above the pixel electrode and includes a first region formed with a first film thickness over a first area and a second region formed with a second film thickness which is less than the first film thickness, over a second area which is less than the first area; an organic layer including a second hole transport layer disposed above the first hole transport layer or the hole injection layer and formed of an organic compound, a light emission layer disposed above the second hole transport layer, and an electron transport layer disposed above the light emission layer; and a counter-electrode disposed above the organic layer.

According to another embodiment, there is provided a manufacturing method of an organic EL device, comprising: forming a pixel electrode; washing a surface of the pixel electrode; forming a first oxide layer above the pixel electrode; washing a surface of the first oxide layer or a surface of the pixel electrode which is not covered with the first oxide layer; forming a second oxide layer on the first oxide layer or the pixel electrode which is not covered with the first oxide layer; forming an organic layer above the second oxide layer or the first oxide layer which is not covered with the second oxide layer; and forming a counter-electrode above the organic layer.

According to another embodiment, there is provided a manufacturing method of an organic EL device, comprising: forming a pixel electrode; forming a first oxide layer above the pixel electrode; washing at least a surface of the first oxide layer; forming a second oxide layer on the first oxide layer; forming an organic layer above the second oxide layer or the first oxide layer which is not covered with the second oxide layer; and forming a counter-electrode above the organic layer.

Embodiments will now be described in detail with reference to the accompanying drawings. In the drawings, structural elements having the same or similar functions are denoted by like reference numerals, and an overlapping description is omitted.

Figure 1:
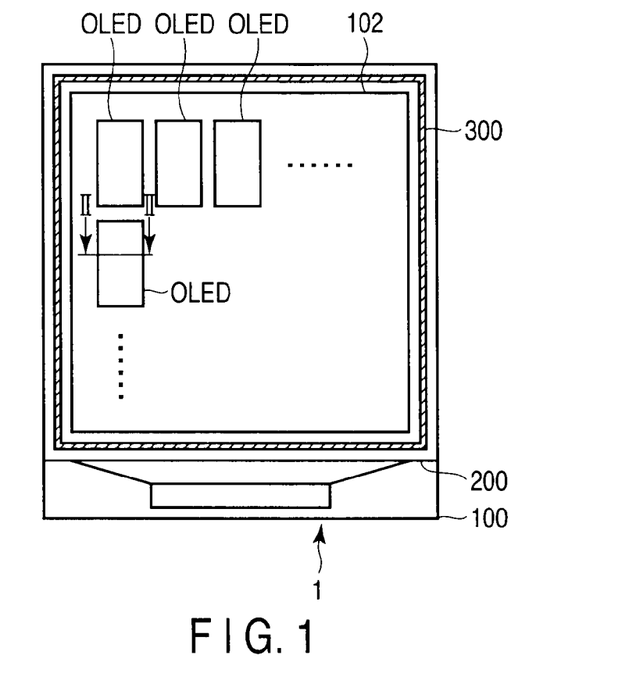
FIG. 1 is a plan view which schematically shows the structure of an organic EL display device according to an embodiment.

FIG. 1 is a plan view which schematically shows the structure of an organic EL display device, as an example of an organic EL device, which adopts an active matrix driving method.

Specifically, the organic EL device includes a display panel 1. The display panel 1 includes an array substrate 100 and a counter substrate 200. The array substrate 100 includes a plurality of matrix-arrayed organic EL elements OLED in a substantially rectangular active area 102 which displays an image. In the active area 102, the counter substrate 200 is opposed to the organic EL elements OLED which are included in the array substrate 100. The counter substrate 200 is a light-transmissive insulating substrate such as a glass substrate or a plastic substrate.

The array substrate 100 and counter substrate 200 are attached to each other via a sealant 300 which is formed in a frame shape surrounding the active area 102. The sealant 300 is formed of, e.g. a resin material or frit glass. In the meantime, it is possible to adopt a solid seal structure in which that surface of the array substrate 100, which is opposed to the counter substrate 200, is covered with a protection film which is formed of an inorganic material. Besides, the space between the protection film and the counter substrate 200 may be filled with a resin material. In the case where the organic EL element OLED is of a top emission type which emits light from the counter substrate 200 side, the protection film and the filling resin material are formed of a light-transmissive material.

Figure 2:
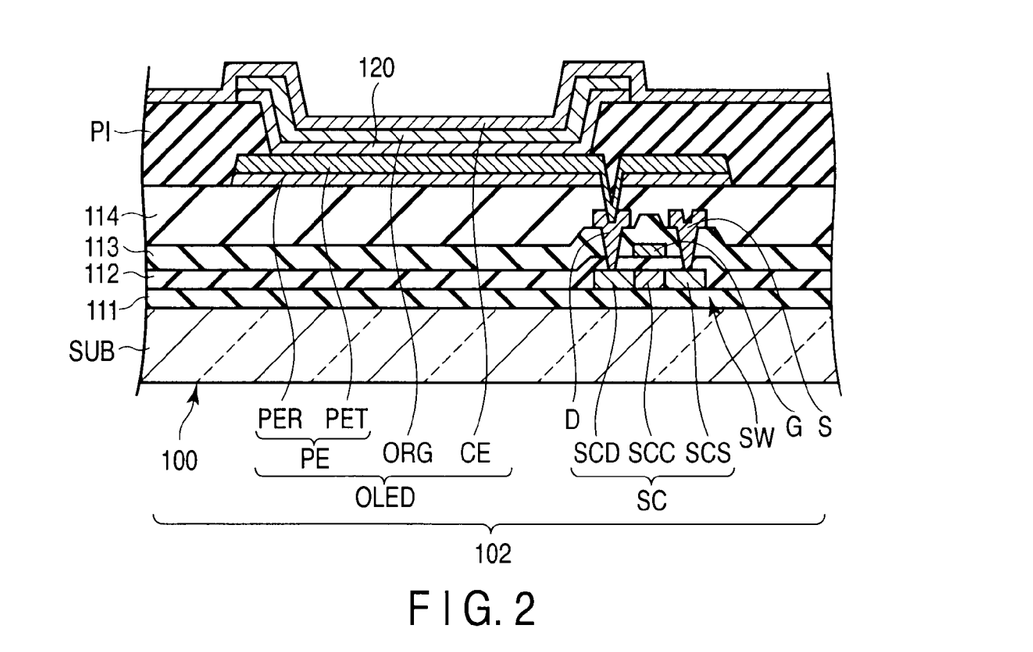
FIG. 2 is a schematic cross-sectional view of an array substrate including an organic EL element of the organic EL display device shown in FIG. 1.

FIG. 2 is a cross-sectional view of the array substrate 100 including the organic EL element OLED of the organic EL display device shown in FIG. 1. The organic EL element OLED shown in FIG. 2 is of a top-emission type. However, in the embodiment, use may be made of an organic EL element OLED of a bottom emission type in which light is emitted from the array substrate 100 side.

The array substrate 100 includes an insulating substrate SUB, such as a glass substrate, and a switching element SW and an organic EL element OLED which are disposed above the insulating substrate SUB. An undercoat layer 111 is disposed on the insulating substrate SUB. The undercoat layer 111 is formed of, for example, an inorganic compound such as silicon oxide or silicon nitride. The undercoat layer 111 extends over almost the entirety of the active area 102.

A semiconductor layer SC of the switching element SW is disposed on the undercoat layer 111. The semiconductor layer SC is formed of, e.g. polysilicon. In the semiconductor layer SC, a source region SCS and a drain region SCD are formed, with a channel region SCC being interposed therebetween.

The semiconductor layer SC is covered with a gate insulation film 112. The gate insulation film 112 is also disposed on the undercoat layer 111. The gate insulation film 112 is formed of, for example, an inorganic compound such as silicon oxide or silicon nitride. The gate insulation film 112 extends over almost the entirety of the active area 102.

A gate electrode G of the switching element SW is disposed on the gate insulation film 112 immediately above the channel region SCC. In this example, the switching element SW is a top-gate type p-channel thin-film transistor. The gate electrode G is covered with a passivation film 113. The passivation film 113 is also disposed on the gate insulation film 112. The passivation film 113 is formed of, for example, an inorganic compound such as silicon oxide or silicon nitride. The passivation film 113 extends over almost the entirety of the active area 102.

A source electrode S and a drain electrode D of the switching element SW are disposed on the passivation film 113. The source electrode S is put in contact with the source region SCS of the semiconductor layer SC. The drain electrode D is put in contact with the drain region SCD of the semiconductor layer SC. The gate electrode G, source electrode S and drain electrode D of the switching element SW are formed of an electrically conductive material such as molybdenum (Mo), tungsten (W), aluminum (Al) or titanium (Ti).

The source electrode S and drain electrode D are covered with an insulation film 114. The insulation film 114 is also disposed on the passivation film 113. The insulation film 114 is formed of an organic compound such as an ultraviolet-curing resin or a thermosetting resin, or an inorganic compound such as silicon nitride. The insulation film 114 extends over almost the entirety of the active area 102.

A pixel electrode PE, which constitutes the organic EL element OLED, is disposed on the insulation film 114. The pixel electrode PE is connected to the drain electrode D of the switching element SW. In this example, the pixel electrode PE corresponds to an anode.

The pixel electrode PE has a two-layer structure in which a reflective electrode PER and a transmissive electrode PET are stacked. The reflective electrode PER is disposed on the insulation film 114. The transmissive electrode PET is disposed on the reflective electrode PER. The reflective electrode PER is formed of a light-reflective electrically conductive material, such as silver (Ag) or aluminum (Al). The transmissive electrode PET is formed of a light-transmissive electrically conductive material, such as indium tin oxide (ITO) or indium zinc oxide (IZO). The structure of the pixel electrode PE is not limited to the above-described two-layer structure, and may be a multilayer structure of three layers or more, or a single-layer structure of the reflective electrode PER or transmissive electrode PET.

A partition wall PI is disposed on the insulation film 114. The partition wall PI is disposed along the peripheral edge of the pixel electrode PE. The partition wall PI overlaps a part of the pixel electrode PE. The partition wall PI is formed of an insulating material, for instance, an organic compound such as an ultraviolet-curing resin or a thermosetting resin, or an inorganic compound of various kinds.

An oxide layer 120 with hole transportability is disposed on the pixel electrode PE. The oxide layer 120 covers the pixel electrode PE which is exposed from the partition wall PI, and extends over the partition wall PI. The details of the oxide layer 120 will be described later. In FIG. 2, the extension of the oxide layer 120 terminates on the partition wall PI, but the oxide layer 120 may extend over the entirety of the active area 102.

An organic layer ORG, which constitutes the organic EL element OLED, is disposed on the oxide layer 120. The organic layer ORG includes at least a light emission layer, and further includes a hole injection layer, a hole transport layer, an electron injection layer, and an electron transport layer. The details of the organic layer ORG will be described later. The material of the organic layer ORG may include a fluorescent material, or may include a phosphorescent material.

A counter-electrode CE, which constitutes the organic EL element OLED, is disposed on the organic layer ORG. The counter-electrode CE covers not only the organic layer ORG, but also the partition wall PI. In this example, the counter-electrode CE corresponds to a cathode. The counter-electrode CE is composed of a semi-transmissive layer which is formed of, e.g. magnesium-silver. The counter-electrode CE may include a transmissive layer which is formed of a light-transmissive electrically conductive material, such as ITO or IZO. The counter-electrode CE extends over the entirety of the active area 102.

Figure 3:
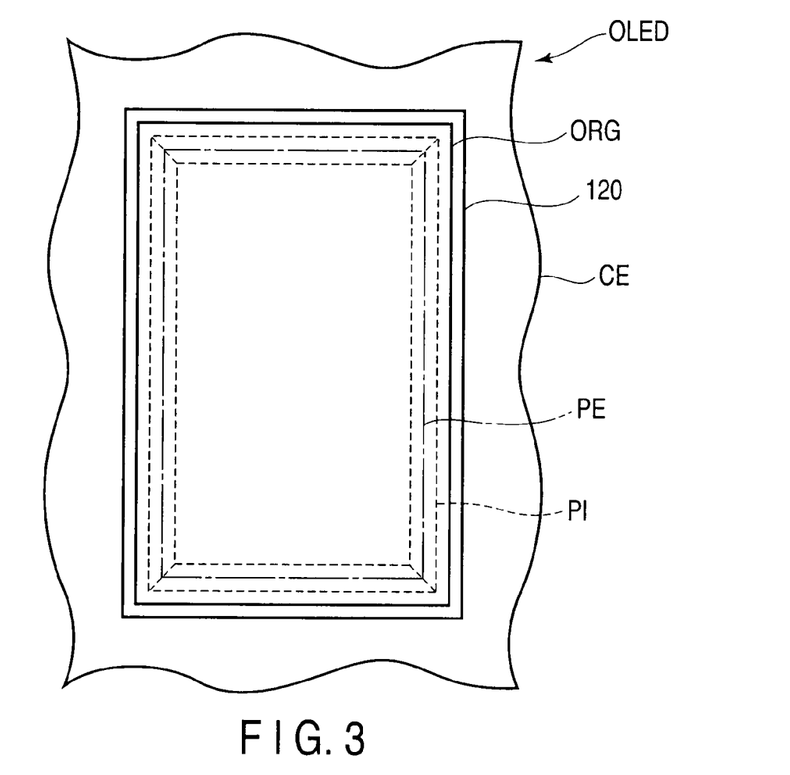
FIG. 3 is a schematic top view of the organic EL display device shown in FIG. 2.

FIG. 3 is a top view of the organic EL element OLED shown in FIG. 2.

In the organic EL element OLED shown in FIG. 3, the pixel electrode PE has a substantially rectangular shape. For example, the pixel electrode PE has a long side with a length of about 100 μm and a short side with a length of about 50 μm. The partition wall PI surrounds the pixel electrode PE, and overlaps the entire peripheral edge of the pixel electrode PE. The oxide layer 120 overlaps the pixel electrode PE and extends onto the partition wall PI. The organic layer ORG overlaps the oxide layer 120 and extends onto the partition wall PI. The counter-electrode CE overlaps the organic layer ORG and extends onto the partition wall PI.

Figure 4:
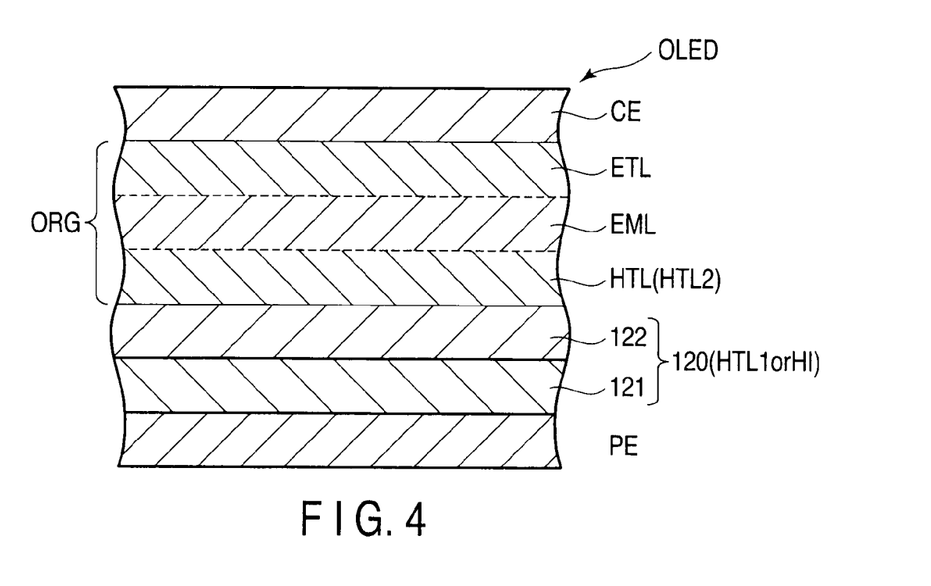
FIG. 4 is a cross-sectional view which schematically shows a main part of the organic EL element in the embodiment.

FIG. 4 is a cross-sectional view which schematically shows a main part of the organic EL element OLED in the embodiment. FIG. 4 shows a cross-sectional structure of the inside part of the organic EL element OLED, which is surrounded by the partition wall (not shown), and omits depiction of the structure which is unnecessary for the description.

The oxide layer 120 includes a first oxide layer 121 which is disposed on the pixel electrode PE, and a second oxide layer 122 which is disposed on the first oxide layer 121. Where necessary, another layer may be disposed between the pixel electrode PE and the first oxide layer 121. The first oxide layer 121 and second oxide layer 122 are formed mainly of an inorganic compound such as molybdenum oxide, and may be doped, where necessary, with a metal such as magnesium. The oxide layer 120 has hole transportability, and can function as a first hole transport layer HTL1 or a hole injection layer HI in the present embodiment.

In the case where the first oxide layer 121 and second oxide layer 122 are formed of the same material, it is possible that the boundary between the first oxide layer 121 and second oxide layer 122 cannot be confirmed. However, in the case where only one of the first oxide layer 121 and second oxide layer 122 is doped with a metal, the boundary between the first oxide layer 121 and second oxide layer 122 can be confirmed. In addition, in the case where only the first oxide layer 121 and second oxide layer 122 are formed of different materials, the boundary between the first oxide layer 121 and second oxide layer 122 can be confirmed.

The organic layer ORG is disposed on the second oxide layer 122. The organic layer ORG includes a hole transport layer HTL which is disposed on the second oxide layer 122, a light emission layer EML which is disposed on the hole transport layer HTL, and an electron transport layer ETL which is disposed on the light emission layer EML. In this description, this hole transport layer HTL is referred to as a second hole transport layer HTL2, so that the hole transport layer HTL may be distinguished from the first hole transport layer HTL1.

While the first hole transport layer HTL1 is formed of the inorganic compound, the second hole transport layer HTL2 is formed of the organic compound. Thus, the boundary between the first hole transport layer HTL1 and the second hole transport layer HTL2 can be confirmed. In the organic layer ORG, there may be a case in which the boundary between the second hole transport layer HTL2 and the light emission layer EML cannot be confirmed.

The counter-electrode CE is disposed on the organic layer ORG.

Figure 5:
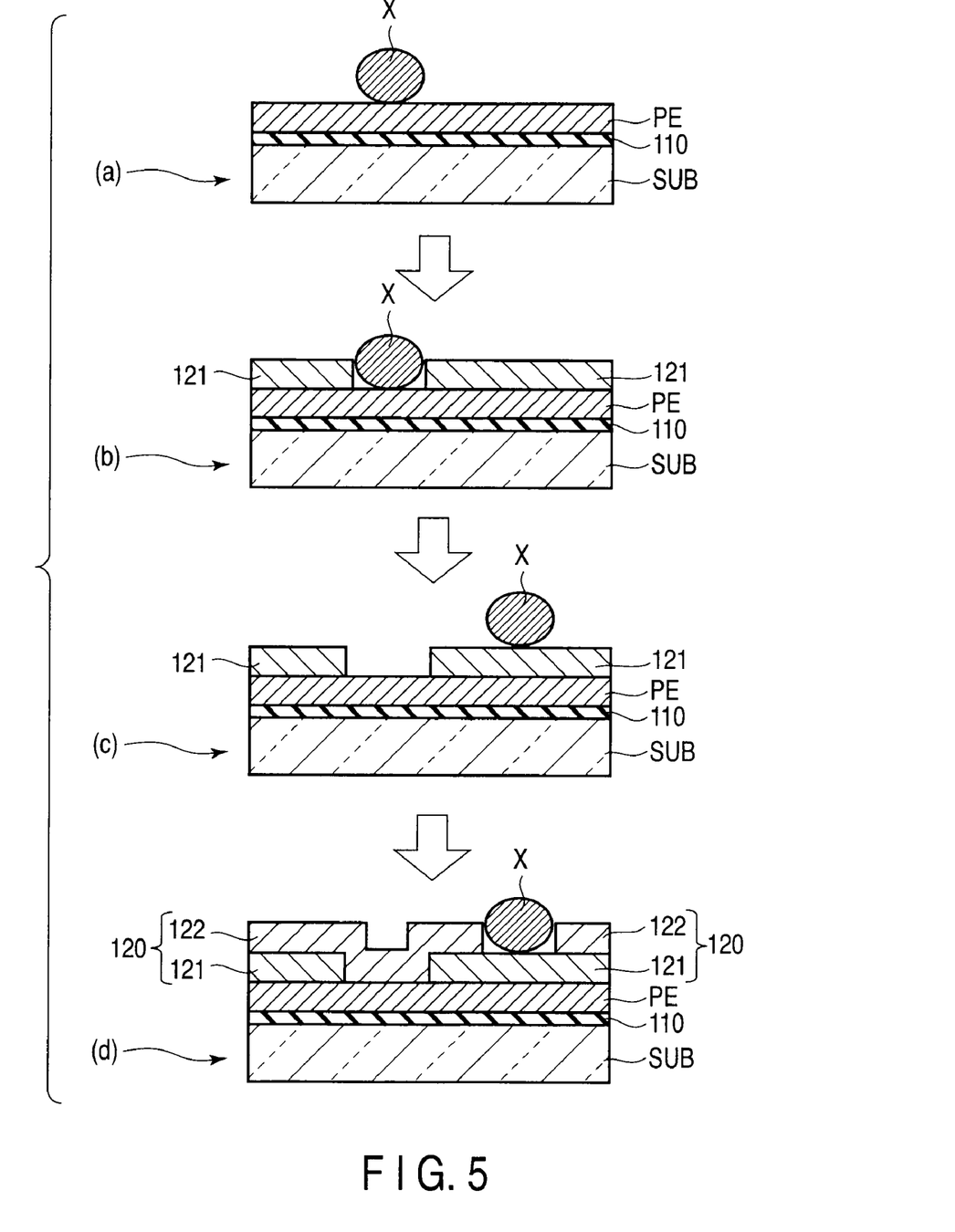
FIG. 5 is a view for describing a manufacturing method of the organic EL element shown in FIG. 4.

Next, referring to FIG. 5, a description is given of a manufacturing method of the organic EL element OLED shown in FIG. 4.

To begin with, as shown in part (a) of FIG. 5, an undercoat layer 111, a gate insulation film 112, a passivation film 113, an insulation film 114, a pixel electrode PE, a switching element (not shown) and a partition wall (not shown) are formed on the insulating substrate SUB, and thereafter a first washing process is performed to wash the surface of the pixel electrode PE and further a drying process is performed. The first washing process is performed, for example, by using pure water, or various solutions of, e.g. alcohols, such as isopropyl alcohol. By the first washing process, foreign matter adhering to, e.g. the surface of the pixel electrode PE is removed. The first washing process may be omitted.

Part (a) of FIG. 5 shows the state after the first washing process, and shows the state in which residual foreign matter X, which could not be removed by the first washing process, or foreign matter, which has adhered in the first washing process, is present on the pixel electrode PE. In FIG. 5, the undercoat layer 111, gate insulation film 112, passivation film 113 and, insulation film 114, which are disposed between the insulating substrate SUB and the pixel electrode PE, are generally referred to as an insulation film 110.

Subsequently, as shown in part (b) of FIG. 5, a first oxide layer 121 is formed as an oxide layer 120 on the pixel electrode PE. For example, as the first oxide layer 121, a thin film of molybdenum oxide with a thickness of 20 nm was formed by an evaporation deposition method. A first resistivity of the thus formed first oxide layer 121 was $1.5 \times 10^7$ Ωcm.

Part (b) of FIG. 5 shows the state in which while the first oxide layer 121 is formed on the pixel electrode PE, the foreign matter X is present on the pixel electrode PE and the first oxide layer 121 is not formed around the foreign matter X. Specifically, the pixel electrode PE in the vicinity of the foreign matter X is not covered with the first oxide layer 121 and is exposed from the first oxide layer 121. In the meantime, in part (b) of FIG. 5, although the first oxide layer 121 deposits on a part of the foreign matter X, the depiction of this state is omitted.

Subsequently, as shown in part (c) of FIG. 5, after the first oxide layer 121 is formed, a second washing process is performed to wash the surface of the first oxide layer 121 and further a drying process is performed. Like the first washing process, the second washing process is a wet process using pure water, or various solutions of, e.g. alcohols. By the second washing process, the foreign matter X adhering to, e.g. the surface of the pixel electrode PE is removed, or the foreign matter X adhering to the pixel electrode PE moves from the surface of the pixel electrode PE or re-adheres.

Part (c) of FIG. 5 shows the state after the second washing process, and shows the state in which the foreign matter X has moved or re-adhered from the surface of the pixel electrode PE to the surface of the first oxide layer 121 due to the second washing process.

Thereafter, as shown in part (d) of FIG. 5, a second oxide layer 122 is formed as the oxide layer 120 on the first oxide layer 121 and the pixel electrode PE which is exposed from the first oxide layer 121 due to the influence of the foreign matter X. For example, as the second oxide layer 122, a thin film in which molybdenum oxide is doped with magnesium by 2%, was formed with a thickness of 20 nm by an evaporation deposition method. A second resistivity of the thus formed second oxide layer 122 was $8.0 \times 10^6$ Ωcm and was lower than the first resistivity of the first oxide layer 121.

Part (d) of FIG. 5 shows the state in which while the second oxide layer 122 is formed on the first oxide layer 121 and pixel electrode PE, the foreign matter X is present on the first oxide layer 121 and the second oxide layer 122 is not formed around the foreign matter X. Specifically, the first oxide layer 121 in the vicinity of the foreign matter X is not covered with the second oxide layer 122 and is exposed from the second oxide layer 122. In the meantime, in part (d) of FIG. 5, although the second oxide layer 122 deposits on a part of the foreign matter X, the depiction of this state is omitted.

Figure 6:
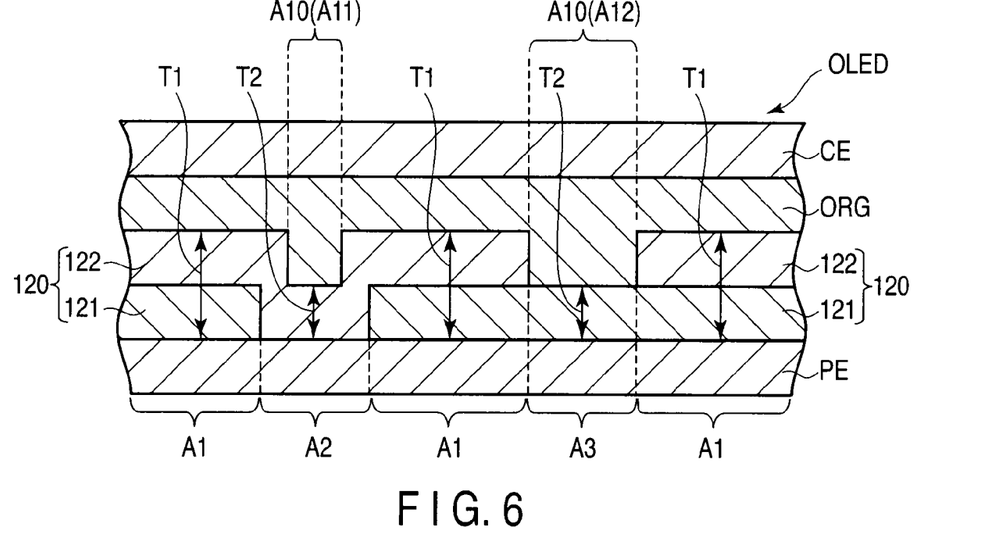
FIG. 6 is a cross-sectional view which schematically shows a main part of the organic EL element which is formed through fabrication steps illustrated in FIG. 5.

Following the above, as shown in FIG. 6, an organic layer ORG was formed on the second oxide layer 122, and a counter-electrode CE was formed on the organic layer ORG. The organic layer ORG was formed such that a second hole transport layer HTL2, a light emission layer EML and an electron transport layer ETL, which are not shown, were stacked in the named order on the second oxide layer 122. In addition, the counter-electrode CE was formed of magnesium-silver. Furthermore, in the present embodiment, a thin film of lithium fluoride (LiF) was formed as an electron injection layer (not shown) between the organic layer ORG and the counter-electrode CE.

FIG. 6 schematically shows the cross-sectional structure of the main part of the organic EL element OLED, which was formed through the above-described fabrication steps, and omits depiction of the structure which is unnecessary for the description.

Paying attention to the oxide layer 120 between the pixel electrode PE and organic layer ORG, the film thickness of the part in which the first oxide layer 121 is not formed and the film thickness of the part in which the second oxide layer 122 is not formed are less than the film thickness of the part in which the first oxide layer 121 and second oxide layer 122 are stacked. The film thickness, in this context, corresponds to the length in the direction of stacking of the respective layers constituting the organic EL element OLED.

In the example shown in FIG. 6, the oxide layer 120 includes a first region A1, a second region A2 and a third layer A3. The first region A1 is a thick film region in the oxide layer 120, and corresponds to the part in which the first oxide layer 121 and second oxide layer 122 are stacked between the pixel electrode PE and the organic layer ORG. In other words, in the first region A1, the first oxide layer 121 is stacked on the pixel electrode PE, the second oxide layer 122 is stacked on the first oxide layer 121, and the organic layer ORG is stacked on the second oxide layer 122.

The second region A2 is a thin film region in the oxide layer 120, and corresponds to the part in which the first oxide layer 121 is not stacked between the pixel electrode PE and the organic layer ORG and the second oxide layer 122 is disposed between the pixel electrode PE and the organic layer ORG. In other words, in the second region A2, the pixel electrode PE is not covered with the first oxide layer 121, the second oxide layer 122 is stacked on the pixel electrode PE, and the organic layer ORG is stacked on the second oxide layer 122.

The third region A3 is a thin film region in the oxide layer 120, and corresponds to the part in which the second oxide layer 122 is not stacked between the pixel electrode PE and the organic layer ORG and the first oxide layer 121 is disposed between the pixel electrode PE and the organic layer ORG. In other words, in the third region A3, the first oxide layer 121 is stacked on the pixel electrode PE, the first oxide layer 121 is not covered with the second oxide layer 122, and the organic layer ORG is stacked on the first oxide layer 121.

The oxide layer 120 in the first region A1 has a first film thickness T1 corresponding to the total of the film thickness of the first oxide layer 121 and the film thickness of the second oxide layer 122. The second region A2 includes a first thin film region A11 which is thinner than the first region A1. The third region A3 includes a second thin film region A12 which is thinner than the first region A1. The entirety of the second region A2 is not necessarily the first thin film region A11, and similarly the entirety of the third region A3 is not necessarily the second thin film region A12. In the present embodiment, the first thin film region A11 and second thin film region A12 are, in some cases, referred to simply as a thin film region A10.

The oxide layer 120 in the thin film region A10 has a second film thickness T2 which is smaller than the first film thickness T1. Specifically, the film thickness of the oxide layer 120 in the first thin film region A11 is the second film thickness T2 which corresponds to the film thickness of only the second oxide film 122. The film thickness of the oxide layer 120 in the second thin film region A12 is the second film thickness T2 which corresponds to the film thickness of only the first oxide film 121. In FIG. 6, the film thickness of the first thin film region A11 and the film thickness of the second thin film region A12 are not necessarily the same second film thickness T2.

As described above, the distance between the pixel electrode PE and the organic layer ORG, between which the first region A1 of the oxide layer 120 is interposed, is greater than the distance between the pixel electrode PE and the organic layer ORG, between which the thin film region A10 of the oxide layer 120 is interposed.

Normally, if there is no influence of foreign matter in the process of forming the first oxide layer 121 and second oxide layer 122, the oxide layer 120 is formed substantially uniformly with the first film thickness T1 over almost the entirety of the pixel electrode PE. In short, almost the entirety of the oxide layer 120 becomes the first region A1.

Also in the case where there occurs an influence of foreign matter in the process of forming the first oxide layer 121 and second oxide layer 122, the oxide layer 120 becomes the first region A1 with the first film thickness T1 in its major part on the pixel electrode PE which is not affected by the foreign matter. On the other hand, in a local part of the oxide layer 120 on the pixel electrode PE, which is affected by the foreign matter, the thin film region A10 with the second film thickness T2 that is less than the first film thickness T1 is formed. In short, a second area where the thin film region A10 is formed is smaller than a first area where the first region A1 is formed.

As described above, the oxide layer 120, which is disposed between the pixel electrode PE and organic layer ORG, includes the first region A1 which is formed with the first film thickness T1 over the first area, and the thin film region A10 which is formed with the second film thickness T2, which is less than the first film thickness T1, over the second area which is smaller than the first area.

In the meantime, the average size of foreign matter is about 100 nm to 500 nm in diameter, and is much smaller than the size of one side of the pixel electrode PE. Accordingly, even if there is foreign matter, the area of the thin film region A10, which is formed by the influence of the foreign matter, is much smaller than the area of the first region A1.

In addition, in the case where the second region A2 and third region A3 are formed due to the same foreign matter, the area in which the second region A2 is formed is substantially equal to the area in which the third region A3 is formed. Even in this case, the area in which the second thin film region A12 included in the third region A3 is formed is greater than the area in which the first thin film region A11 included in the second region A2 is formed.

Specifically, the oxide layer 120 includes the first region A1 where the first oxide layer 121 and second oxide layer 122 are stacked between the pixel electrode PE and the organic layer ORG; the second region A2 where the first oxide layer 121 is not stacked between the pixel electrode PE and the organic layer ORG and the second oxide layer 122 is disposed between the pixel electrode PE and the organic layer ORG, the second region A2 including the first thin film region A11 that is thinner than the first region A1; and the third region A3 where the second oxide layer 122 is not stacked between the pixel electrode PE and the organic layer ORG and the first oxide layer 121 is disposed between the pixel electrode PE and the organic layer ORG, the third region A3 including the second thin film region A12 that is thinner than the first region A1. In addition, the second thin film region A12 is formed over a wider area than the first thin film region A11.

In the case where the oxide layer 120 is not disposed between the pixel electrode PE and the organic layer ORG, if the organic layer ORG is deposited by evaporation in the state in which foreign matter is present on the pixel electrode PE in the process of forming the organic EL element OLED, it is possible that the organic layer ORG is not uniformly deposited by evaporation due to the influence of the foreign matter and a part of the pixel electrode PE is exposed from the organic layer ORG. Consequently, if the counter-electrode CE is deposited by evaporation following the formation of the organic layer ORG, short-circuit would occur between the pixel electrode PE and the counter-electrode CE. In the organic EL element OLED in the state in which such short-circuit occurs, a display defect occurs, leading to dot defects. To cope with this problem, it is necessary to remove foreign matter in advance by sufficient washing, prior to the formation of the organic layer ORG. However, there is a case in which such foreign matter cannot completely be removed.

According to the present embodiment, the organic EL element OLED includes the oxide layer 120 which is disposed between the pixel electrode PE and organic layer ORG. In the example shown in FIG. 4, the oxide layer 120 comprises the first oxide layer 121 and the second oxide layer 122 which is stacked on the first oxide layer 121. In the process of forming the oxide layer 120, after the first oxide layer 121 is formed, the washing step is performed and then the second oxide layer 122 is formed.

Thus, even if foreign matter adheres on the pixel electrode PE in the process of forming the first oxide layer 121, the foreign matter is removed by the washing step which is performed prior to the formation of the second oxide layer 122. In the step of forming the second oxide layer 122, which follows this washing step, the second oxide layer 122 is stacked on the first oxide layer 121, and the part, where the first oxide layer 121 is not formed due to the influence of the foreign matter and the pixel electrode PE is exposed, is covered with the second oxide layer 122. Thus, the pixel electrode PE is exactly covered with at least one of the first oxide layer 121 and the second oxide layer 122.

According to the organic EL element OLED which is obtained by forming the organic layer ORG on the oxide layer 120 and then forming the counter-electrode CE on the organic layer ORG, short-circuit between the pixel electrode PE and the counter-electrode CE can be suppressed. Therefore, the occurrence of dot defects can also be suppressed.

Even if foreign matter, which is removed in the washing step prior to the formation of the second oxide layer 122, re-adheres on the first oxide layer 121, the pixel electrode PE is covered with the underlying first oxide layer 121, although the second oxide layer 122 is not formed in the vicinity of the foreign matter. It is thus possible to prevent short-circuit between the pixel electrode PE and counter-electrode CE.

In the EL step between the step of forming the pixel electrode PE and the step of forming the counter-electrode CE, the foreign matter adheres to the substrate at random. Thus, the possibility is low that foreign matter re-adheres to the same position, from which the foreign matter was once removed, in the handling after the washing process. Therefore, by performing the washing step after the formation of the first oxide layer 121 and by forming the second oxide layer 122 after the foreign matter is removed, it becomes possible to reduce dot defects.

As regards the display panel 1 which was formed through the above-described fabrication steps, the number of dot defects was counted and the following result was obtained. The display panel 1, which was formed, is of a QVGA mode (320×RGB×240; 230,400 sub-pixels in total) in which each of the pixels comprises a red sub-pixel including an organic EL element which emits red light, a green sub-pixel including an organic EL element which emits green light and a blue sub-pixel including an organic EL element which emits blue light. The number of dot defects was 20 in the case where the oxide layer 120 was not formed, whereas the number of dot defects was reduced to 3 in the case where the oxide layer 120 was formed.

In addition, in the display panel 1 formed by the above-described process, the second resistivity ($8.0\times10^6$ Ωcm) of the second oxide layer 122 is lower than was the first resistivity ($1.5\times10^7$ Ωcm) of the first oxide layer 121. It is thus possible to prevent an increase in driving voltage due to the increase in resistance of the oxide layer 120 between the pixel electrode PE and the organic layer ORG.

In the above-described embodiment, the case has been described in which the oxide layer 120 is the multilayer structure comprising the first oxide layer 121 and second oxide layer 122. Alternatively, the oxide layer 120 may be a multilayer structure comprising three or more oxide layers of an inorganic compound.

In the above-described embodiment, since the first oxide layer 121, which is formed prior to the washing step using pure water, etc., is made of the inorganic compound, the first oxide layer 121 is not peeled off in the washing step. However, in the case where the first oxide layer 121 is formed of an organic compound, it is possible that the first oxide layer 121 may be peeled off in the washing step. Thus, the organic compound is not preferable as the material of the first oxide layer 121.

Figure 7:
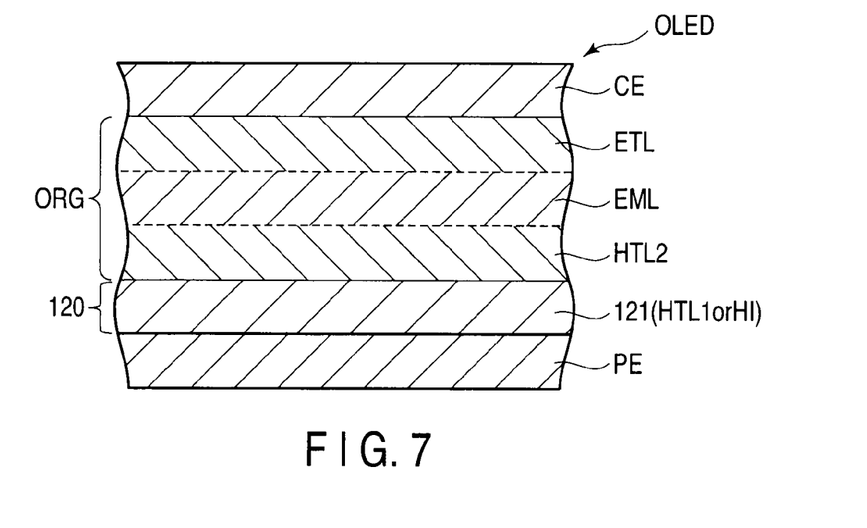
FIG. 7 is a cross-sectional view which schematically shows a main part of an organic EL element in another embodiment.

On the other hand, the second oxide layer 122, which is formed after the washing step, may be replaced with a hole transport layer which is formed of an organic compound. FIG. 7 is a cross-sectional view which schematically shows a main part of an organic EL element OLED in another embodiment. FIG. 7 omits depiction of the structure which is unnecessary for the description.

An oxide layer 120 is disposed on the pixel electrode PE. In the example shown in FIG. 7, the oxide layer 120 is formed of a first oxide layer 121. The first oxide layer 121 is formed of an inorganic compound. The first oxide layer 121 has hole transportability and functions as a first hole transport layer HTL1 or a hole injection layer HI in the present embodiment.

An organic layer ORG is disposed on the first oxide layer 121. The organic layer ORG includes a second hole transport layer HTL2 which is disposed on the first oxide layer 121, a light emission layer EML which is disposed on the second hole transport layer HTL2, and an electron transport layer ETL which is disposed on the light emission layer EML.

While the first oxide layer 121 is formed of the inorganic compound, the second hole transport layer HTL2 is formed of the organic compound. Thus, the boundary between the first oxide layer 121 and the second hole transport layer HTL2 can be confirmed. In the organic layer ORG, there may be a case in which the boundary between the second hole transport layer HTL2 and the light emission layer EML cannot be confirmed.

The counter-electrode CE is disposed on the organic layer ORG.

Figure 8:
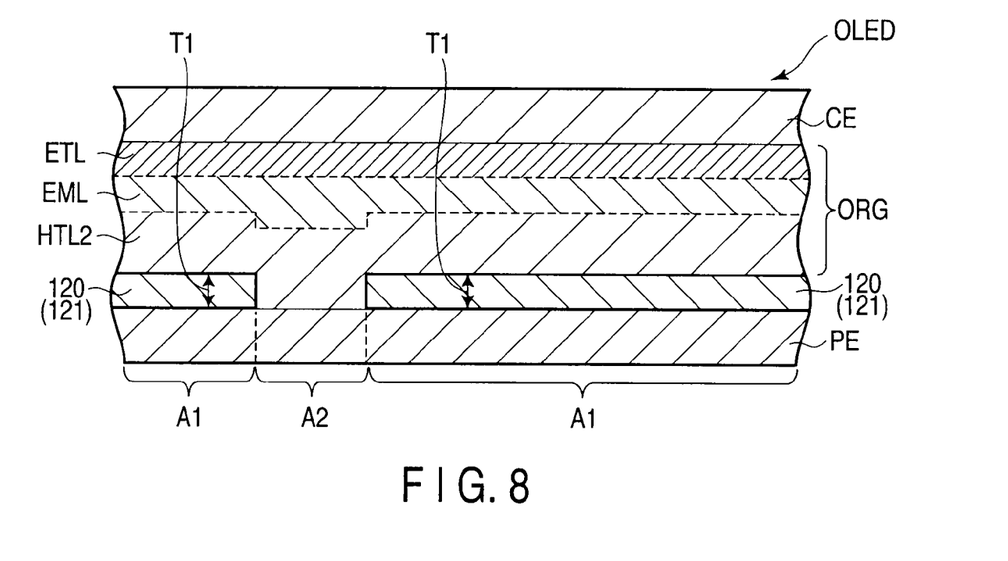
FIG. 8 is a cross-sectional view which schematically shows a main part of an organic EL element which has been affected by foreign matter in a manufacturing process.

Next, referring to FIG. 8, a brief description is given of a manufacturing method of the organic EL element OLED shown in FIG. 7. FIG. 8 schematically shows the cross section of a main part of the thus formed organic EL element OLED.

After the pixel electrode PE, etc. are formed, a first washing process and a drying process are performed. Then, a first oxide layer 121, which is formed of an inorganic compound, is formed on the pixel electrode PE. When the first oxide layer 121 is formed on the pixel electrode PE, the first oxide layer 121 is not formed at foreign matter adhering on the pixel electrode PE and in the vicinity of the foreign matter. The pixel electrode PE in the vicinity of the foreign matter is not covered with the first oxide layer 121 and is exposed from the first oxide layer 121.

After the first oxide layer 121 is formed, a second washing process and a drying process are performed. Following the formation of the first oxide layer 121, a second hole transport layer HTL2 which is formed of an organic compound, a light emission layer EML and an electron transport layer ETL are formed in the named order as an organic layer ORG. Then, a counter-electrode CE is formed and an organic EL element OLED is obtained.

The second hole transport layer HTL2, which is informed in the above process, is formed on the first oxide layer 121 and is also formed on the pixel electrode PE that is exposed from the first oxide layer 121. As regards the thus formed second hole transport layer HTL2, the upper surface thereof, that is, the boundary surface thereof with the light emission layer EML, is not planar, and the part immediately above the pixel electrode PE exposed from the first oxide layer 121 is recessed, compared to the part stacked on the first oxide layer 121. As regards the organic layer ORG, as described above, there may be a case in which the boundary between the second hole transport layer HTL2 and the light emission layer EML cannot be confirmed.

As shown in FIG. 8, paying attention to the oxide layer 120 between the pixel electrode PE and organic layer ORG, the film thickness of the part in which the first oxide layer 121 is not formed is less than the film thickness of the part in which the first oxide layer 121 is formed.

In the example shown in FIG. 8, the oxide layer 120 includes a first region A1 and a second region A2. The first region A1 corresponds to the part in which the first oxide layer 121 is formed between the pixel electrode PE and the organic layer ORG. In other words, in the first region A1, the first oxide layer 121 is stacked on the pixel electrode PE, and the organic layer ORG is stacked on the first oxide layer 121. In the second region A2, the first oxide layer 121 is not formed between the pixel electrode PE and the organic layer ORG, the pixel electrode PE is not covered with the first oxide layer 121, and the second hole transport layer HTL2 of the organic layer ORG is stacked on the pixel electrode PE.

The oxide layer 120 in the first region A1 has a first film thickness T1 corresponding to the film thickness of the first oxide layer 121. The second region A2 is thinner than the first region A1, since the first oxide layer 121 constituting the oxide layer 120 is not formed in the second region A2 and the film thickness of the oxide layer 120 is zero.

In this organic EL element OLED, too, after the first oxide layer 120 is formed on the pixel electrode PE, the washing step and the drying step are performed, and then the second hole transport layer HTL2 is formed. Thus, even if foreign matter adheres on the pixel electrode PE in the process of forming the first oxide layer 121, the foreign matter is removed by the washing step which is performed prior to the formation of the second hole transport layer HTL2. In the step of forming the second hole transport layer HTL2, which follows this washing step, the second hole transport layer HTL2 is stacked on the first oxide layer 121, and the part, where the first oxide layer 121 is not formed due to the influence of the foreign matter and the pixel electrode PE is exposed, is covered with the second hole transport layer HTL2. Thus, the pixel electrode PE is exactly covered with at least one of the first oxide layer 121 and the second hole transport layer HTL2.

According to this organic EL element OLED, short-circuit between the pixel electrode PE and the counter-electrode CE can be suppressed. Therefore, the occurrence of dot defects can also be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the embodiments, the organic EL display device has been described as the organic EL device. However, the organic EL device is applicable to organic EL illuminations, organic EL printer heads, etc.

What is claimed is:

1. An organic EL device comprising:
    a pixel electrode;
    an organic layer disposed above the pixel electrode;
    a counter-electrode disposed above the organic layer; and
    an oxide layer disposed between the pixel electrode and the organic layer, the oxide layer including a first region formed with a first film thickness over a first area and a second region formed with a second film thickness which is less than the first film thickness, over a second area which is less than the first area,
    wherein the oxide layer includes a first oxide layer disposed above the pixel electrode, and a second oxide layer disposed on the first oxide layer.

2. The organic EL device according to claim 1, wherein the second region includes a first thin film region in which the first oxide layer is not formed between the pixel electrode and the organic layer and the second oxide layer is disposed between the pixel electrode and the organic layer, and a second thin film region in which the second oxide layer is not formed between the pixel electrode and the organic layer and the first oxide layer is disposed between the pixel electrode and the organic layer.

3. The organic EL device according to claim 1, wherein the first oxide layer and the second oxide layer are formed of an inorganic compound.

4. An organic EL device comprising:
    a pixel electrode;
    an organic layer disposed above the pixel electrode;
    a counter-electrode disposed above the organic layer; and
    an oxide layer disposed between the pixel electrode and the organic layer, the oxide layer including a first region formed with a first film thickness over a first area and a second region formed with a second film thickness which is less than the first film thickness, over a second area which is less than the first area,
    wherein the oxide layer is a hole transport layer or a hole injection layer.

5. The organic EL device according to claim 1, wherein the organic layer includes a light emission layer, and a hole transport layer which is disposed between the light emission layer and the oxide layer.

6. The organic EL device according to claim 5, wherein the organic layer further includes an electron transport layer disposed between the light emission layer and the counter-electrode.

7. An organic EL device comprising:
    a pixel electrode;
    a first hole transport layer or a hole injection layer which is disposed above the pixel electrode and includes a first region formed with a first film thickness over a first area and a second region formed with a second film thickness which is less than the first film thickness, over a second area which is less than the first area;
    an organic layer including a second hole transport layer disposed above the first hole transport layer or the hole injection layer and formed of an organic compound, a light emission layer disposed above the second hole transport layer, and an electron transport layer disposed above the light emission layer; and a counter-electrode disposed above the organic layer.

8. The organic EL device according to claim 7, wherein the first hole transport layer or the hole injection layer is formed of an inorganic compound.

9. The organic EL device according to claim 7, wherein the first hole transport layer or the hole injection layer includes a first oxide layer disposed above the pixel electrode, and a second oxide layer disposed on the first oxide layer.

10. The organic EL device according to claim 9, wherein the second region includes a first thin film region in which the first oxide layer is not formed between the pixel electrode and the second hole transport layer and the second oxide layer is disposed between the pixel electrode and the second hole transport layer, and a second thin film region in which the second oxide layer is not formed between the pixel electrode and the second hole transport layer and the first oxide layer is disposed between the pixel electrode and the second hole transport layer.

* * * * *